(12) United States Patent
Hara

(10) Patent No.: US 6,577,677 B1
(45) Date of Patent: Jun. 10, 2003

(54) METHOD AND APPARATUS FOR ANALOG BIAS CURRENT OPTIMIZATION

(75) Inventor: Susumu Hara, Gold River, CA (US)

(73) Assignee: Level One Communications, Sacramento, CA (US)

( * ) Notice: Subject to any disclaimer, the term of this patent is extended or adjusted under 35 U.S.C. 154(b) by 0 days.

(21) Appl. No.: 09/473,747

(22) Filed: Dec. 28, 1999

(51) Int. Cl.$^7$ ................................................ H04B 1/38
(52) U.S. Cl. ........................... 375/219; 455/69; 455/70; 455/78; 455/89; 455/343
(58) Field of Search ................................ 375/219, 345; 370/278, 282, 286, 292; 379/406.06, 406.15, 402, 405; 455/78, 84, 87, 68, 69, 70, 343

(56) References Cited

U.S. PATENT DOCUMENTS 6,081,558 A * 6/2000 North .................. 250/214 AG
6,282,177 B1 * 8/2001 Ostermiller et al. ........ 370/278
6,311,048 B1 * 10/2001 Loke ........................ 455/245.1
2002/0008788 A1 * 1/2002 Talmola et al. ............. 348/732

\* cited by examiner

*Primary Examiner*—Amanda T. Le
(74) *Attorney, Agent, or Firm*—Merchant & Gould, P.C.

(57) ABSTRACT

An analog bias current optimization circuitry in a transceiver of a data communication system is capable of controlling the amount of a bias current of each of analog circuits. The analog bias current optimization circuitry generates a signal pattern which is sent to the analog circuits, such as TX-D/A converter, driver, RX-A/D converter, etc., and evaluates the signal quality of the analog circuits. Based on the evaluated signal quality, a bias current to each of the analog circuits is adjusted. A margin may be added to the bias current to ensure the signal quality in case there is a change in power supply voltage and/or temperature. One method of evaluating the signal quality of the analog circuits is to evaluate the residual echo of the output of an echo canceller (EC). Another method is to evaluate a signal error in a decision feedback equalizer (DFE). A further method is to evaluate a harmonic distortion at the output of a filter.

22 Claims, 5 Drawing Sheets

METHOD AND APPARATUS FOR ANALOG BIAS CURRENT OPTIMIZATION

TECHNICAL FIELD

The present invention relates in general to data communication systems, and more particularly, to a method and apparatus for optimizing analog bias current for minimizing power consumption in circuits used in data communication systems.

BACKGROUND

Most electronic devices like TV's, stereos, and computers need integrated circuits work properly. Today's wireless communications markets are being driven by a multitude of benefits derived from these circuits. These markets include products such as cellular phones, cordless phones, pagers, and the like have freed corporate and individual users from their desks and homes and are driving the demand for additional equipment and systems to increase their utility. Consequently, data transmission products will play an increasingly important role in the overall communications infrastructure in the next decade.

Mixed-signal integration and power management have taken on added importance now that analog and mixed analog-digital ICs have become the fastest-growing segment of the semiconductor industry. Integration strategies for multimedia consoles, cellular telephones and battery-powered portables are being developed, as well as applications for less integrated but highly specialized building blocks that serve multiple markets. These building blocks include drivers, data converters, filters, amplifiers and processors.

One aspect of data transmission devices in today's telecommunication industry is designing integrated circuits with lower power consumption and exceptional performance characteristics. The soaring popularity of powerful cellular telephones and laptop computers drives manufacturers to develop smaller communication devices utilizing these circuits. A continuing goal of the ever-developing communication industry is to design smaller, faster, and lower power consuming devices. Nevertheless, some barriers must be overcome to achieve this goal.

One of the barriers is to minimize the amount of power consumption in analog circuits without degrading the performance of critical analog circuits. Typically, a large amount of power is consumed due to the required amount of bias current used in analog circuits. For example, the amount of bias current for analog circuits is generally set in such a way that the performance of the analog circuits would meet required performance specification in the worst silicon fabrication condition. Often time, it is not necessary to have such amount of bias current but the performance of the analog circuits would still meet required performance specification. Accordingly, this causes the power consumption of analog circuits to be more than what it could be for most silicon fabrication condition.

It is with respect to these or other considerations that the present invention has been made.

SUMMARY

In accordance with the present invention, the above and other problems are solved by providing an analog bias current optimization circuitry. The analog bias current optimization circuitry in accordance with the principles of the present invention is capable of minimizing power consumption in analog circuits without degrading the performance of the circuits.

In one embodiment of the present invention, an analog bias current optimization circuitry includes a transmit digital signal processor (TX-DSP) to generate a signal pattern; a plurality of analog circuits to convert data between a digital format and an analog format, to transmit the analog data to a transmission line, and to receive the analog data from the transmission line, the signal pattern being sent to the analog circuits; a receive digital signal processor (RX-DSP) to receive an output signal from the analog circuits; and a controller, based on a captured signal from the RX-DSP, to evaluate signal quality degradation of the analog circuits and adjust a bias current of the analog circuits without causing signal quality degradation.

Further in one embodiment of the present invention, the evaluation of signal quality degradation and adjustment of the bias current of the analog circuits can be performed continuously by the controller.

Still in one embodiment of the present invention, the RX-DSP includes an echo canceller (EC). A residual echo or echo error of the EC is evaluated by the controller.

Additional in one embodiment of the present invention, the RX-DSP includes a decision feedback equalizer (DFE). A DFE error is evaluated by the controller.

Yet in one embodiment of the present invention, the analog bias current optimization circuitry includes a switch. The switch switches between a first position wherein the signal received by the RX-DSP is only from the analog circuits, and a second position wherein the signal received by the RX-DSP is hybrid, i.e. from both the analog circuits and the transmission line.

In one embodiment of the present invention, a method of optimizing analog bias current includes generating a signal pattern by a transmit digital signal processor (TX-DSP); sending the signal pattern to a plurality of analog circuits which convert data between a digital format and an analog format, transmit the analog data to a transmission line, and receive the analog data from the transmission line; receiving an output signal from the analog circuits by a receive digital signal processor (RX-DSP); and evaluating signal quality degradation of the analog circuits from a captured signal in the RX-DSP and adjusting a bias current of the analog circuits without causing signal quality degradation, by a controller, based on the captured signal from the RX-DSP.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE PREFERRED EMBODIMENT

The present invention provides an analog bias current optimization circuitry. The analog bias current optimization circuitry can be adapted for a transceiver of a data transmission system. The analog bias current optimization circuitry in accordance with the principles of the present invention is capable of minimizing power consumption in analog circuits without degrading the performance of the circuits.

Before describing in detail a particular embodiment of an analog bias current optimization circuitry and method in accordance with the present invention, it should be understood that other embodiments may be utilized as structural changes may be made without departing from the scope of the present invention, and that the present invention resides primarily in a novel structural combination of conventional signal processing and communication circuits and components and not in the particular detailed configurations thereof. Accordingly, the structure, arrangement, and control of these conventional circuits and components have been illustrated in drawings by readily understandable block diagrams which show only those specific details that are pertinent to the present invention, so as not to obscure the disclosure with structural details which will be readily apparent to those skilled in the art having the benefit of the description herein. Thus, the block diagram illustrations of the figures do not necessarily represent the electrical or mechanical structural arrangement of an exemplary system or circuitry, but are primarily intended to illustrate the major structural components of the system or circuitry in a convenient functional group, so that the present invention may be more readily understood.

Figure 1:
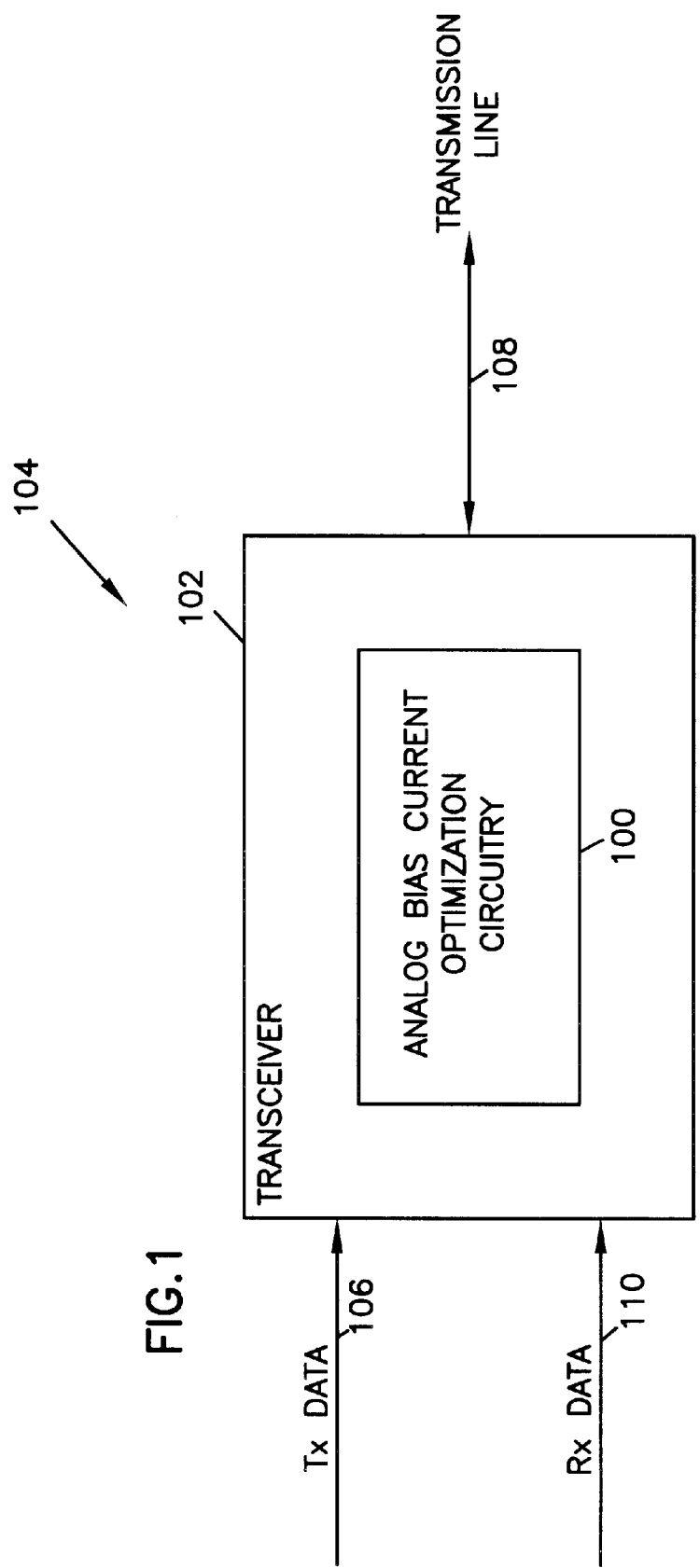
FIG. 1 illustrates a block diagram of one embodiment of a transceiver of a data transmission system having an analog bias current optimization circuitry in accordance with the principles of the present invention.

FIG. 1 illustrates one embodiment of an analog bias current optimization circuitry 100 in accordance with the principles of the present invention in a transceiver 102 of a data transmission system 104. Transmit data (TX Data) is received by the transceiver 102 in a transmit line 106 and sent to a transmission line 108. Receive data (RX Data) is received from the transmission line 108 and sent to a receive line 110 of the transceiver 102. The analog bias current optimization circuitry 100 controls the amount of a bias current utilized by each of the analog circuits in the transceiver 102 such that the present invention minimizes power consumption in the transceiver 102 without causing performance degradation of the analog circuits.

Figure 2:
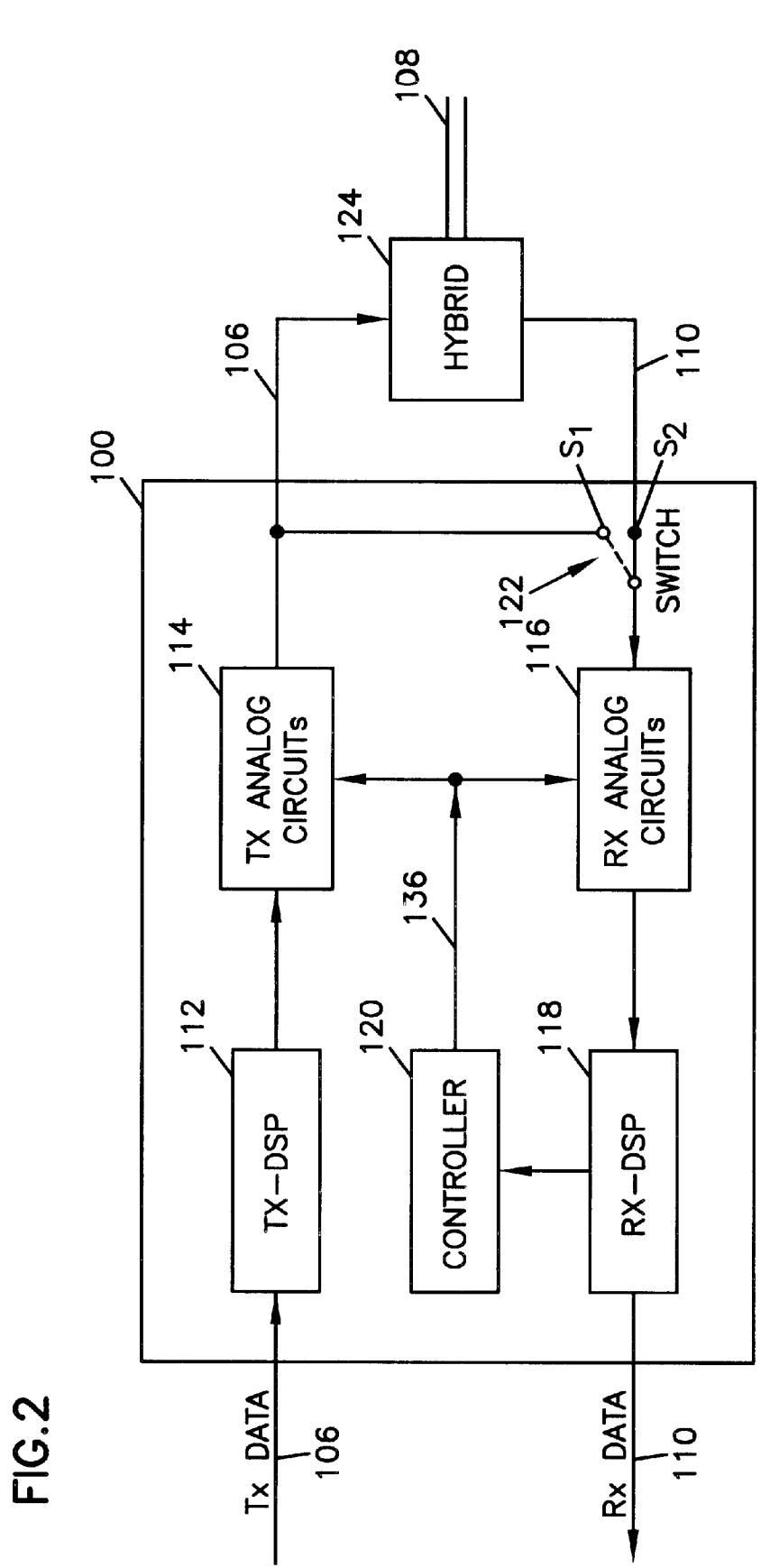
FIG. 2 illustrates a block diagram of one embodiment of an analog bias current optimization circuitry used in a transceiver of a data transmission system in accordance with the principles of the present invention.

In FIG. 2, the analog bias current optimization circuitry 100 in the transceiver includes a transmit digital signal processor (TX-DSP) 112, a plurality of transmit (TX) analog circuits 114, a plurality of receive (RX) analog circuits 116, a receive digital signal processor (RX-DSP) 118, and a controller 120. The TX-DSP 112 generates a signal pattern which is sent to the TX analog circuits 114. The signal from the TX analog circuits 114 is routed to the RX analog circuits 116. The RX-DSP 118 then receives an output signal from the RX analog circuits 116 and captures a signal pattern which is then sent to the controller 120. Based on the signal pattern captured from the RX-DSP 118, the controller 120 evaluates signal quality degradation of the TX and RX analog circuits and adjusts a bias current of each of the TX and RX analog circuits without causing signal quality degradation. An adjustment signal from the controller 120 is sent to the TX analog circuits 114 and the RX analog circuits 116.

Figure 4:
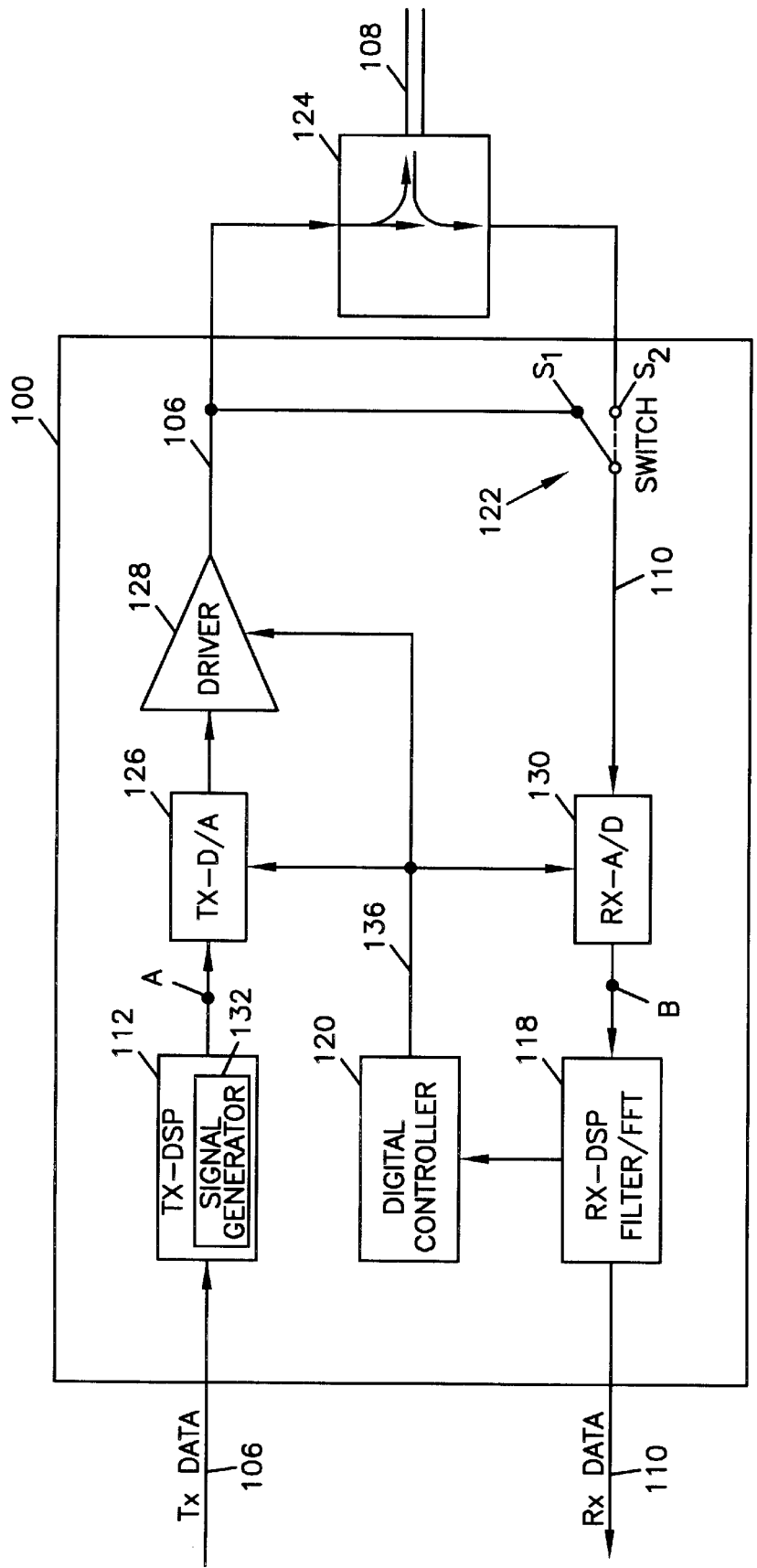
FIG. 4 illustrates a detailed block diagram of another embodiment of an analog bias current optimization circuitry in a transceiver of a data transmission system in accordance with the principles of the present invention.

Also in FIG. 2, a switch 122 is used between the transmit line 106 and the receive line 110. At a first position SI of the switch 122, the signal from TX analog circuits 114 is directly routed to the RX analog circuits 116 (FIG. 4). At a second position S2 of the switch 122, the signal from TX analog circuits 114 is routed to the RX analog circuits 118 via a hybrid 124. The hybrid 124 transmits data to the transmission line 108 and receives data from the transmission line 108. Accordingly, the signal sent to the RX analog circuits 118 via the hybrid 124 may include both the signal from the TX analog circuits 114 and the signal from the transmission line 108. Generally, in an initial test mode period, the switch 122 is switched to its first position S1, and in a usual activation and operation period of data transmission, the switch 122 is switched to its second position S2.

Figure 3:
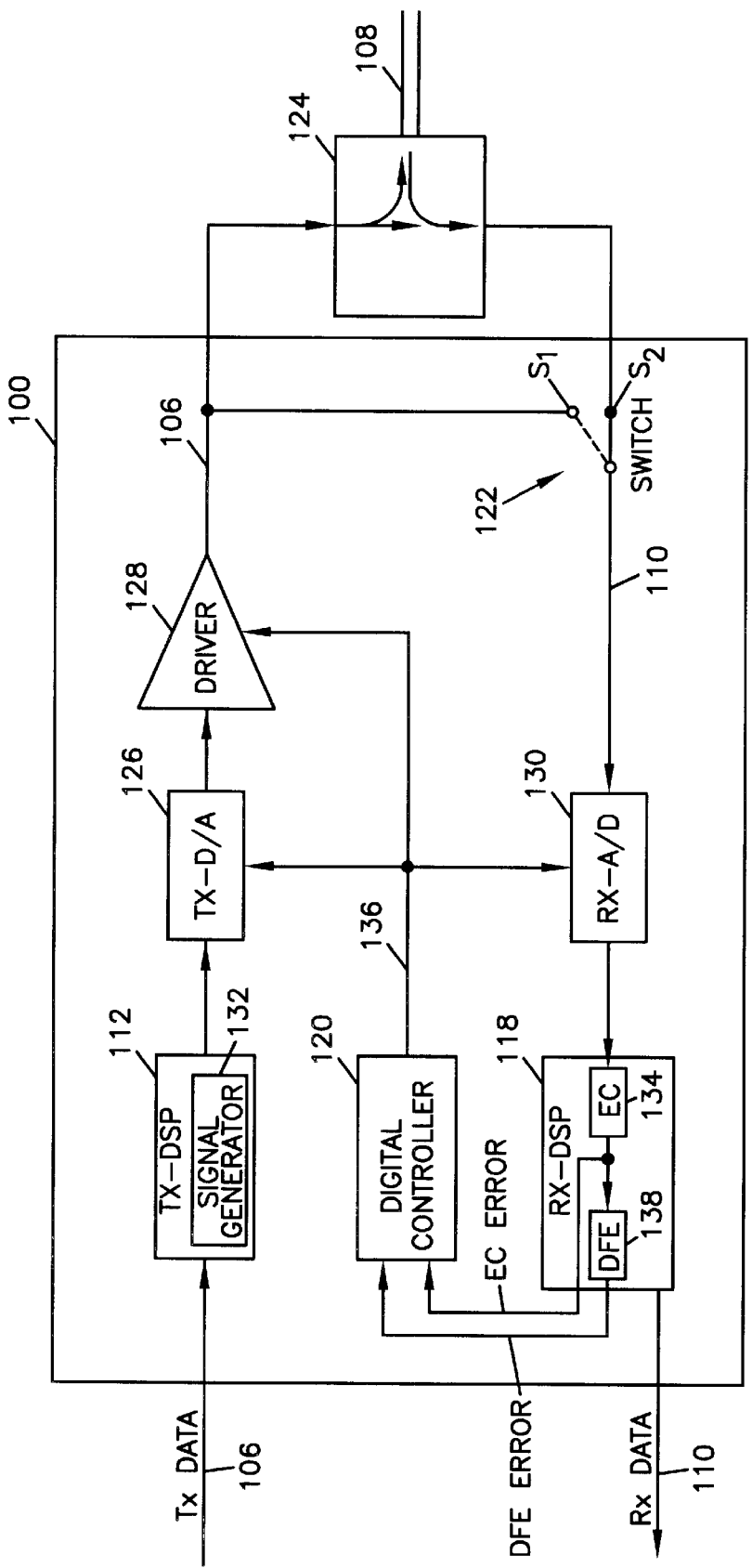
FIG. 3 illustrates a detailed block diagram of one embodiment of an analog bias current optimization circuitry used in a transceiver of a data transmission system in accordance with the principles of the present invention.

In FIG. 3, the TX analog circuits 114 may include a TX-D/A converter 126 and a driver 128. The TX-D/A converter 126 converts data from a digital format to an analog format. The drive 128 drives the data to the transmission line 108. The RX analog circuits 116 may include a RX-A/D converter 130. The RX-A/D converter 130 converts data from an analog format to a digital format.

As shown in FIG. 3, the TX-DSP 112 may include a signal generator 132 to generate a known signal pattern, for example, a clock wave signal, a sinusoidal signal, etc. The RX-DSP 118 may include an echo canceller (EC) 134. The EC 134 is known in digital communication art and not the focus of the present invention. Generally, the EC 134 subtracts replica of a transmit signal from a receive signal. A residual echo or echo error at the output of the EC 134 will increase if the analog circuits 114,116 in the echo path have nonlinearity. Such residual echo or echo error is sent to the controller 120. Accordingly, by monitoring the echo error from the EC 134, the controller 120 is capable of evaluating the linearity of the echo path while adjusting an analog bias current level for each of the analog circuits 114,116. The controller 120 is arranged to first reduce the bias current of the analog circuits via line 136 while evaluating the signal quality, e.g. the linearity of the echo path, of the EC 134. If the signal quality degradation does not exceed a certain threshold, the controller 120 then further reduces the bias current until the degradation of signal exceeds the threshold. The amount of degradation may be stored in an internal memory in the controller 120. A margin may be added to the bias current when the signal quality degradation is about to exceed the threshold so as to ensure the quality of the signal in case there is a change in power supply voltage and/or temperature. Accordingly, the bias current of analog circuits is optimized. This type of optimization by evaluating the output of the EC 134 can be used in a usual activation period when the transceiver 102 is not receiving incoming signal from the other side of the transmission line 108. It is appreciated that the signal quality degradation threshold can be a predetermined value.

It is noted that in FIGS. 2–4, a single line is drawn for the line 136. However, the line 136 preferably represents multiple lines for sending multiple control signals/current bias to different analog circuits. It is appreciated that the line 136 can be in many other forms, for example, a single line with addressed signals, etc.

Also, the RX-DSP 118 may include a decision feedback equalizer (DFE) 138. The DFE 138 is known in digital communication art and is not the focus of the present invention. Generally, the DFE 138 equalizes the transmission cable characteristics. An error signal in the DFE 138 will increase if the analog circuits have nonlinearity. Similar to evaluating the output from the EC 134, the controller 120 may alternatively evaluate a signal pattern from the DFE 138, instead, while reducing the bias current of each of the analog circuits. A margin may also be added to the bias current when the signal quality degradation is about to exceed the threshold to ensure the quality of the signal in case there is a change in power supply voltage and/or temperature. Accordingly, the bias current of each of the analog circuits is optimized. This type of optimization by evaluating the output of the DFE 138 can be used both in a usual activation period when the transceiver 102 is not receiving incoming signal from the other side of the transmission line 108, and in a usual operation period of the data transmission when the transceiver 102 is receiving an incoming signal from the other side of the transmission line 108.

Also as shown in FIG. 3, the switch 122 is switched to the second position S2 wherein the RX-A/D 130 receives both the incoming signal from the other side of the transmission line 108 and the output signal from the driver 128 in a usual operation period of data transmission. During a usual activation period, the RX-A/D 130 merely receives the output signal from the driver 128.

In FIG. 4, another embodiment of the analog bias current optimization circuitry 100 in the transceiver 102 is shown. The TX-DSP 112 generates a pure sinusoidal signal, and the switch 122 is switched to the first position S1 such that the signal from the TX analog circuits 114 (e.g. TX-D/A 126, driver 128, etc.) is directly routed to the RX analog circuits 116 (e.g. RX-A/D 130, etc.). The RX-DSP 118 is preferably an FFT or filter which captures a harmonic distortion component caused by the analog circuits. This method may be used for such a transceiver that does not have either EC or DFE. It is appreciated that other types of filters, such as FIR, IIR filters, can be used within the scope of the present invention.

Figure 5:
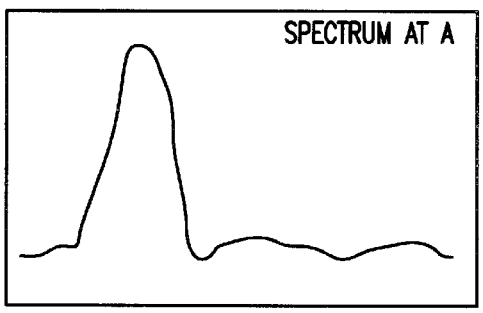
FIG. 5 illustrates a signal spectrum at point A in FIG. 4.
Figure 6:
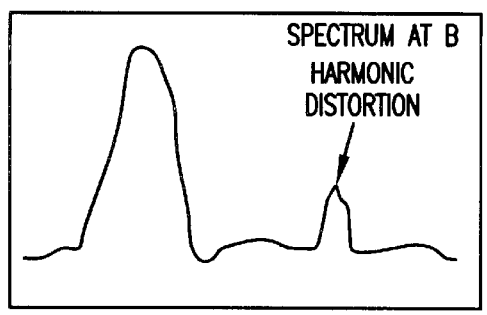
FIG. 6 illustrates a signal spectrum at point B in FIG. 4.

FIG. 5 illustrates a signal spectrum at point A in FIG. 4. FIG. 6 illustrates a signal spectrum at point B in FIG. 4. A harmonic distortion is illustrated in FIG. 6. Similar to evaluating the output from the EC 134 or the DFE 138, the controller 120 evaluates the harmonic distortion while reducing the bias current of each of the analog circuits via line 136. A margin may also be added to the bias current when the signal quality degradation is about to exceed the threshold to ensure the quality of the signal in case there is a change in power supply voltage and/or temperature. Accordingly, the bias current of each of the analog circuits is optimized. This type of optimization by monitoring the harmonic distortion may be used only in a usual activation period or an initial test mode period when the transceiver 102 is not receiving an incoming signal from the other side of the transmission line 108.

Figure 7:
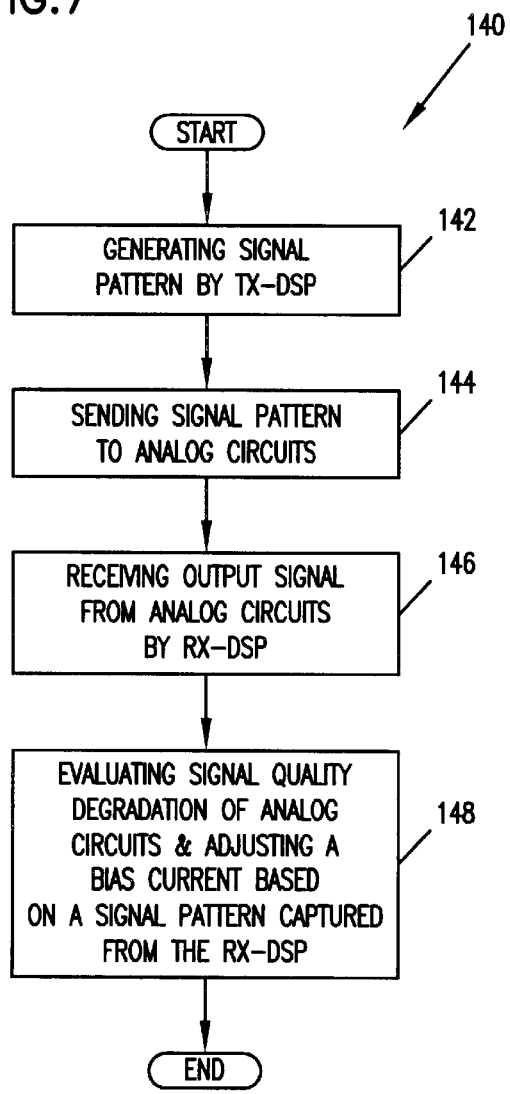
FIG. 7 is an operational flow diagram illustrating an analog bias current optimization method in accordance with the principles of the present invention.

In FIG. 7, an operational flow 140 of analog bias current optimization operations in accordance with the principles of the present invention is illustrated. The operational flow 140 starts with an operation 142 of generating a signal pattern by a TX-DSP. The signal pattern is then sent to analog circuits in an operation 144. Next, an output signal is received from the analog circuits by a RX-DSP in an operation 146. Finally, a controller evaluates/monitors signal quality degradation of the analog circuits from a captured signal in the RX-DSP and adjusts a bias current of each of the analog circuits without causing signal quality degradation based on the captured signal from the RX-DSP in an operation 148.

It is appreciated that the evaluation/monitoring of signal quality degradation and adjustment of the bias current of each of the analog circuits by the controller can be performed continuously. It is also appreciated that the controller can be any suitable controller, preferably a digital controller, within the scope of the present invention.

Accordingly, the power consumption by the analog circuits is minimized while the signal performance of the analog circuits maintains undegraded.

It is appreciated that the above analog current optimization circuitry and the method thereof can be used in many other systems without departing from the principles of the present invention.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. An analog bias current optimization circuitry, comprising:
   a transmit digital signal processor (TX-DSP) to generate a signal pattern;
   a plurality of analog circuits, coupled to the TX-DSP, to convert data between a digital format and an analog format, to transmit the analog data to a transmission line, and to receive the analog data from the transmission line, the signal pattern being sent to the analog circuits;
   a receive digital signal processor (RX-DSP), coupled to the plurality of analog circuits, to receive an output signal from the analog circuits; and
   a controller to evaluate signal quality degradation of the analog circuits from a captured signal in the RX-DSP and adjust a bias current of the analog circuits without causing signal quality degradation, based on the captured signal from the RX-DSP.

2. The circuitry of claim 1, wherein the evaluation of signal quality degradation and adjustment of the bias current of the analog circuits are performed continuously by the controller.

3. The circuitry of claim 1, wherein the adjustment of the bias current of the analog circuits further provides a margin for the bias current when the signal quality degradation is about to exceed a predetermined threshold.

4. The circuitry of claim 1, wherein the RX-DSP includes an echo canceller (EC), an echo error from the EC is evaluated by the controller.

5. The circuitry of claim 4, further comprising a switch, wherein the switch is switched to a second position wherein the signal received by the EC is from both the analog circuits and the transmission line.

6. The circuitry of claim 1, wherein the RX-DSP includes a decision feedback equalizer (DFE), a DFE error from the DFE is evaluated by the controller.

7. The circuitry of claim 6, further comprising a switch, wherein the switch is switched to a second position wherein the signal received by the DFE is from both the analog circuits and the transmission line.

8. The circuitry of claim 1, wherein the RX-DSP includes a filter, a harmonic distortion from the filter is evaluated by the controller.

9. The circuitry of claim 8, wherein the signal pattern generated by the TX-DSP is a sinusoidal signal pattern.

10. The circuitry of claim 1, further comprising a switch, wherein when the switch is switched to a first position, the signal received by the RX-DSP is only from the analog circuits, and when the switch is switched to a second position, the signal received by the RX-DSP is from both the analog circuits and the transmission line.

11. The circuitry of claim 9, further comprising a switch, wherein the switch is switched to a first position wherein the signal received by the filter is only from the analog circuits.

12. A method of optimizing analog bias current, comprising:

generating a signal pattern by a transmit digital signal processor (TX-DSP);

sending the signal pattern to a plurality of analog circuits;

receiving an output signal from the analog circuits by a receive digital signal processor (RX-DSP); and evaluating signal quality degradation of the analog circuits from a captured signal in the RX-DSP and adjusting a bias current of the analog circuits without causing signal quality degradation, by a controller, based on the captured signal from the RX-DSP.

13. The method of claim 12, wherein the analog circuits convert data between a digital format and an analog format, transmit the analog data to a transmission line, and receive the analog data from the transmission line.

14. The method of claim 12, wherein the adjusting of the bias current of the analog circuits includes adding a margin for the bias current when the signal quality degradation is about to exceed a predetermined threshold.

15. The method of claim 12, wherein the evaluation of signal quality degradation and adjustment of the bias current of the analog circuits are performed continuously by the controller.

16. The method of claim 12, wherein the evaluation of the captured signal from the RX-DSP includes evaluation of an echo error from an EC of the RX-DSP.

17. The method of claim 12, wherein the evaluation of the captured signal from the RX-DSP includes evaluation of an DFE error from a decision feedback equalizer (DFE) of the RX-DSP.

18. The method of claim 12, wherein the evaluation of the captured signal from the RX-DSP includes evaluation of a harmonic distortion from a filter of the RX-DSP.

19. The method of claim 12, further comprising switching a switch between a first position and a second position, wherein when the switch is switched to a first position, the signal received by the RX-DSP is only from the analog circuits, and when the switch is switched to a second position, the signal received by the RX-DSP is from both the analog circuits and the transmission line.

20. A data communication system, comprising:

a transceiver to transmit/receive data to/from a data transmission line;

the transceiver comprising an analog bias current optimization circuitry which comprises:

a transmit digital signal processor (TX-DSP) to receive the transmit data and generate a signal pattern;

a plurality of analog circuits, coupled to the TX-DSP, to convert data between a digital format and an analog format, to transmit the analog data to a transmission line, and to receive the analog data from the transmission line, the signal pattern being sent to the analog circuits;

a receive digital signal processor (RX-DSP), coupled to the plurality of analog circuits, to receive an output signal from the analog circuits; and a controller to evaluate signal quality degradation of the analog circuits from a captured signal in the RX-DSP and adjust a bias current of the analog circuits without causing signal quality degradation, based on the captured signal from the RX-DSP.

21. An analog bias current optimization circuitry, comprising:

a transmit digital signal processor (TX-DSP) to generate a signal pattern;

a plurality of analog circuits, coupled to the TX-DSP, to convert data between a digital format and an analog format, to transmit the analog data to a transmission line, and to receive the analog data from the transmission line, the signal pattern being sent to the analog circuits;

a receive digital signal processor (RX-DSP), coupled to the plurality of analog circuits, to receive an output signal from the analog circuits;

a controller to evaluate signal quality degradation of the analog circuits from a captured signal in the RX-DSP and adjust a bias current of the analog circuits without causing signal quality degradation, based on the captured signal from the RX-DSP; and a switch, wherein when the switch is switched to a first position, the signal received by the RX-DSP is only from the analog circuits, and when the switch is switched to a second position, the signal received by the RX-DSP is from both the analog circuits and the transmission line.

22. A method of optimizing analog bias current, comprising:

generating a signal pattern by a transmit digital signal processor (TX-DSP);

sending the signal pattern to a plurality of analog circuits;

receiving an output signal from the analog circuits by a receive digital signal processor (RX-DSP);

evaluating signal quality degradation of the analog circuits from a captured signal in the RX-DSP and adjusting a bias current of the analog circuits without causing signal quality degradation, by a controller, based on the captured signal from the RX-DSP; and switching a switch between a first position and a second position, wherein when the switch is switched to a first position, the signal received by the RX-DSP is only from the analog circuits, and when the switch is switched to a second position, the signal received by the RX-DSP is from both the analog circuits and the transmission line.

* * * * *